US007056643B2

(12) United States Patent
Ray et al.

(10) Patent No.: US 7,056,643 B2
(45) Date of Patent: Jun. 6, 2006

(54) PREPARATION OF A PRINTING PLATE USING INK-JET

(75) Inventors: Kevin B. Ray, Fort Collins, CO (US); S. Peter Pappas, Juno Beach, FL (US); Kevin Wieland, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 82 days.

(21) Appl. No.: 10/682,707

(22) Filed: Oct. 9, 2003

(65) Prior Publication Data

US 2005/0079453 A1 Apr. 14, 2005

(51) Int. Cl.
*G03F 7/30* (2006.01)

(52) U.S. Cl. ............................... 430/273.1; 430/281.1; 430/292; 430/300; 430/302; 430/309; 430/322

(58) Field of Classification Search ............. 430/273.1, 430/281.1, 292, 300, 302, 309, 322
See application file for complete search history.

(56) References Cited

U.S. PATENT DOCUMENTS 3,685,993 A * 8/1972 Mukherjee ............... 430/270.1
4,833,486 A 5/1989 Zerillo
4,917,988 A * 4/1990 Koizumi et al. ............ 430/169
5,312,654 A 5/1994 Arimatsu et al.
5,495,803 A 3/1996 Gerber et al.
5,738,013 A 4/1998 Kellett
6,131,514 A 10/2000 Simmons
6,187,380 B1 2/2001 Hallman et al.
6,245,421 B1 6/2001 Aurenty et al.
6,341,560 B1 1/2002 Shah et al.
6,359,056 B1 3/2002 Aurenty et al.
6,739,260 B1 * 5/2004 Damme et al. ............. 101/465
6,772,687 B1 * 8/2004 Damme et al. ............. 101/465
2002/0104455 A1 8/2002 Deutsch et al.
2002/0121208 A1 9/2002 DeBoer et al.

FOREIGN PATENT DOCUMENTS

EP 1120247 A2 8/2001
EP 1157825 A1 11/2001
EP 1157826 A1 11/2001
EP 1157827 A1 11/2001
EP 1157828 A1 11/2001
EP 1211063 A1 6/2002
EP 1219415 A1 7/2002
EP 1258349 A1 11/2002
EP 1266750 A1 12/2002
JP 62-025081 2/1987
JP 63-109052 5/1988
WO WO 94/11191 5/1994
WO WO 00/37254 6/2000
WO WO 02/094571 A 8/2000
WO WO 01/34394 A1 5/2001
WO WO 01/49506 A2 7/2001
WO WO 01/54915 A1 8/2001

OTHER PUBLICATIONS

Zhang et al, A Novel Photosensitive Ternary Complex Consisting of Phenol-Formaldehyde Resin, Sodium Dodecyl Sulfate, and Diazo Resin, Journal of Polymer Science: Part A: Polymer Chemistry, (2000), pp. 2566-2571, vol. 38.

* cited by examiner

*Primary Examiner*—Hoa Van Le

(57) ABSTRACT

A method for forming an image useful as a lithographic printing plate is disclosed. The imageable precursor comprises a water solubilized phenolic resin made up of an insoluble phenolic resin and a surfactant. The precursor can be imaged with an imaging solution, either off press or on press, using ink jet imaging techniques. The resulting imaged precursor can be developed using an aqueous liquid, such as water or a fountain solution, either off press or on press.

29 Claims, No Drawings

PREPARATION OF A PRINTING PLATE USING INK-JET

FIELD OF THE INVENTION

The invention relates to lithographic printing. In particular, this invention relates to a method for forming an image useful as a lithographic printing plate using ink jet imaging techniques.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed, revealing the underlying hydrophilic surface of the substrate. If the imaged regions are removed, the precursor is positive working. Conversely, if the unimaged regions are removed, the precursor is negative working. In each instance, the regions of the imageable layer (i.e., the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation typically has been carried out through a mask, which has clear and opaque areas. Imaging takes place in the regions under the clear areas of the mask but does not occur in the regions under the opaque areas. If corrections are needed, a new mask must be made. In addition, dimensions of the mask may change slightly due to changes in temperature and humidity. Thus, the same mask, when used at different times or in different environments, may give different results and could cause registration problems.

Direct digital imaging, which obviates the need for imaging through a mask, is becoming increasingly important in the printing industry. Imageable elements for the preparation of lithographic printing plates have been developed for use with infrared lasers. Although direct digital imaging has eliminated the mask, the equipment required for imaging, known as a platesetter, is expensive and can be complex, requiring, for example, computer controlled high intensity lasers.

Imaged imageable elements typically require processing in a developer to convert them to lithographic printing plates. Processing introduces additional costs in, for example, the cost of the developer, the cost of the processing equipment, and the cost of operating the process. However, on-press developable lithographic printing plate precursors can be directly mounted on a press after imaging and developed with ink and/or fountain solution during the initial press operation. These precursors do not require a separate development step before mounting on press. On press imaging, in which the precursor is both imaged and developed on press, eliminates mounting the precursor in a separate imaging device.

Thus, a need exists for a method for imaging a printing plate precursor that retains the advantages of using data in digital form and thus does not use a mask for imaging, yet does not require expensive and complex equipment. In addition, the precursors used in this method should be capable of being developed on press, so that neither a developer nor a separate development step is required. Preferably, the precursors should also be imageable on press.

SUMMARY OF THE INVENTION

The invention is a method for forming an image, useful as a lithographic printing plate. The method comprise the steps of:

a) imaging an imageable precursor that comprises an overlayer over a substrate by imagewise applying an imaging solution to the overlayer and forming an imaged precursor comprising imaged and complementary unimaged regions in the overlayer;

in which:

the substrate has a hydrophilic surface;

the overlayer is over the hydrophilic surface of the substrate;

the overlayer comprises a water-solubilized phenolic resin;

the water-solubilized phenolic resin comprises a water-insoluble phenolic resin and a surfactant selected from the group consisting of anionic surfactants, nonionic surfactants, and mixtures thereof; and the imaging solution comprises a water soluble insolubilizing agent; and b) developing the imaged precursor with an aqueous liquid and removing the unimaged regions, thus revealing the underlying hydrophilic surface of the substrate, without removing the imaged regions.

The method of the invention retains the advantages of using data in digital form, yet does not require expensive and complex equipment for imaging. The imaged precursors can be developed with water or on press using fountain solution. When the imaged precursor is developed on press, processors and developers are not required. Thus, in another aspect of the invention, development is carried out on press. In a further aspect, imaging is also carried out on press.

DETAILED DESCRIPTION OF THE INVENTION

Unless the context indicates otherwise, in the specification and claims, the terms surfactant, phenolic resin, novolac resin, insolubilizing agent, coating solvent, and similar terms also include mixtures of such materials. Unless otherwise specified, all percentages are percentages by weight.

Imageable Precursor

Substrate

The substrate comprises a support, which may be any material conventionally used to prepare imageable elements or imageable precursors useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a cylinder in a printing press, typically about 100 μm to about 600 μm. Typically, the substrate comprises an interlayer between the aluminum support and the underlayer. The interlayer may be formed by treatment of the aluminum support with, for example, silicate, dextrine, hexafluorosilicic acid, phosphate/fluoride, polyvinyl phosphonic acid (PVPA) or vinyl phosphonic acid copolymers.

The back side of the support (i.e., the side opposite the overlayer) may be coated with an antistatic agent and/or a slipping layer or matte layer to improve handling and "feel" of the imageable precursor.

Overlayer

The overlayer comprises a water solubilized phenolic resin. The water solubilized phenolic resin comprises an insoluble phenolic resin and a surfactant. The formation of such resins is disclosed in Y. Zhang and W. Cao, *J. Polym. Sci: Part A: Polymer Chemistry*, 38, 2566–2571 (2000), incorporated herein by reference. These water solubilized phenolic resins are not the same as phenolic resins that have been water solubilized by the introduction of solubilizing groups, such as for example sulfate, that are chemically bonded to the resin. Nor are these water solubilized phenolic resins the same as anionically stabilized polymer particles, such as are disclosed in EP 1 266 750 A1.

Phenolic resins have a multiplicity of phenolic hydroxyl groups, either on the polymer backbone or on pendent groups. Novolac resins, resol resins, acrylic resins that contain pendent phenol groups, and polyvinyl phenol resins are preferred phenolic resins. Novolac resins are more preferred. Other phenolic resins useful as the polymeric material include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes.

Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-resol, mixtures of m-cresol and p-cresol, or phenol with formaldehyde using conventional conditions.

The water insoluble phenolic resin is water-solubilized by the following method. The phenolic resin is neutralized with aqueous base, such as aqueous sodium hydroxide. An anionic or nonionic surfactant is added to the resulting mixture. Acid is added and the phenolic resin hydroxyl groups are re-acidified. However, the phenolic resin does not precipitate out of the aqueous solution. Though not being bound by any theory or explanation, it is believed the phenolic resin is solubilized by formation of micelles with the surfactant. The aqueous solution of phenolic resin is then coated onto a hydrophilic substrate.

Numerous anionic surfactants are well known to those skilled in the art. Anionic surfactants are salts, especially water soluble sodium, potassium, ammonium, and substituted ammonium, such as the cations of ethanol amine, diethanol amine, and triethanol amine, salts in which the surfactant portion is negatively charged. These surfactants include, for example: alkyl benzene sulfonates in which the alkyl group contains about 9 to about 15 carbon atoms; alkyl sulfonates in which the alkyl group contains about 10 to about 20 carbon atoms, especially linear alkylbenzene sulfonates in which the alkyl group contains, on average, about 10 to about 18 carbon atoms, such as triethanol amine dodecylbenzenesulfonate, sodium dodecylbenzenesulfonate, and sodium octyl sulfonate; salts of alkyl naphthalene sulfonic acids, such as methyl naphthalene sodium sulfonate; sulfates of alkyl alcohols in which the alkyl group contains about 8 to about 18 carbon atoms, such as sodium cetyl sulfate, sodium lauryl sulfate, ammonium lauryl sulfate, triethanolamine lauryl sulfate, sodium myristyl sulfate, sodium stearyl sulfate, and disodium lauryl sulfosuccinate; sulfates of ethoxylated alkyl alcohols in which the alkyl group contains about 10 to about 22, preferably about 12 to about 18, carbon atoms, and the polyoxyethylene chain contains about 0.5 to about 22, preferably about 1 to about 3, moles of ethylene oxide per molecule, such as sodium polyoxyethylene lauryl ether sulfate and ammonium polyoxyethylene lauryl ether sulfate; sulfates of ethoxylated alkyl phenols in which the alkyl group contains about 8 to about 10 carbon atoms and the polyoxyethylene chain contains about 4 to about 15 moles of ethylene oxide per molecule; phosphates of alkyl alcohols, ethoxylated alkyl alcohols, and ethoxylated alkyl phenols, such as sodium monolaurylphosphate and sodium dilaurylphosphate; and alkyl glyceryl ether sulfonates and sulfates. A preferred anionic surfactant is sodium lauryl sulfate (sodium dodecyl sulfate).

Nonionic surfactants are well known to those skilled in the art. They generally are condensation products of a hydrophobic organic aliphatic or alkyl aromatic compound and hydrophilic ethylene oxide and/or propylene oxide. Practically any hydrophobic compound having a carboxy, hydroxy, amido, or amino group with a free hydrogen attached to the nitrogen or the oxygen can be condensed with ethylene oxide and/or propylene oxide to form a water-soluble nonionic surfactant. Further, the length of the resulting polyether chain can be adjusted to achieve the desired balance between the hydrophobic and hydrophilic properties. Nonionic surfactants include, for example, ethoxylates of alkyl phenols containing from about 8 to 18 carbon atoms in a straight- or branched chain alkyl group, such as t-octyl phenol and t-nonyl phenol with about 5 to 30 moles of ethylene oxide, for example nonyl phenol condensed with about 9.5 moles of ethylene oxide, dinonyl phenol condensed with about 12 moles of ethylene oxide; ethoxylates of primary alcohols containing about 8 to 18 carbon atoms in a straight or branched chain configuration with about 5 to 30 moles of ethylene oxide, for example, lauryl or myristyl alcohol condensed with about 16 moles of ethylene oxide, tridecanol condensed with about 6 to moles of ethylene oxide, myristyl alcohol condensed with about ten moles of ethylene oxide, and the condensation product of ethylene oxide with a cut of coconut fatty alcohol containing a mixture of fatty alcohols with alkyl chains varying from 10 to about 14 carbon atoms in which the condense contains either about 9 moles of ethylene oxide; ethoxylates of secondary aliphatic alcohols containing 8 to 18 carbon atoms in a straight or branched chain configuration with 5 to 30 moles of ethylene oxide; condensation of aliphatic alcohols containing about 8 to abut 20 carbon atoms with ethylene oxide and propylene oxide; and ethoxylates of sorbitan esters such as polyoxyethylene (4) sorbitan monolaurate, polyoxyethylene (4) sorbitan monostearate, polyoxyethylene (20) sorbitan trioleate and polyoxyethylene (20) sorbitan tristearate.

Preparation of the Imageable Precursor

The imageable precursor may be prepared by applying the overlayer over the hydrophilic surface of the substrate using conventional techniques. The overlayer may be applied by any conventional method, such as coating or lamination. Typically the ingredients are dispersed or dissolved in a suitable coating solvent, and the resulting mixture coated by conventional methods, such as spin coating, bar coating, gravure coating, die coating, slot coating, or roller coating. After coating, the layer is dried to remove the water. The resulting element may be air dried at ambient temperature or at an elevated temperature, such as at about 65° C. for about 20 seconds in an oven. Alternatively, the resulting element may be dried by blowing warm air over the element. Typically the coating weight is about 0.1 $g/m^2$ to about 1.5 $g/m^2$, especially about 0.2 $g/m^2$ to about 1.0 $g/m^2$.

Imaging and Processing

An imaging solution is applied imagewise to the overlayer to form a latent image consisting of unimaged regions, i.e., regions to which imaging solution was not applied, and complementary imaged regions, i.e., regions to which the imaging solution was applied. The latent image is converted to the image by removing the unimaged regions, revealing the surface of the underlying substrate, without removing the imaged regions.

The overlayer can be insolubilized by application of an insolubilizing agent. Typically the insolubilizing agent is applied as an aqueous solution. Useful insolubilizing agents include, for example cationic dispersing agents such as DISPERBYK® 130 and DISPERSBYK® 182, cationic polymers having quaternary ammonium groups, and diazonium salts. Examples of water soluble cationic polymers are cationic hydroxyalkyl celluloses, copolymers of diallylammonium salts and acrylamides, polyvinyl imidazolinium compounds, quaternized polyethyleneimine, quaternized vinylpyrrolidone/vinylimidazole polymers, and polymeric quaternary ammonium salts, such as polyquaternium-1, polyquaternium-2, poly-quaternium-4, polyquaternium-5, polyquaternium-6, polyquaternium-7, polyquaternium-8, polyquaternium-9, poly-quaternium-10, polyquaternium-11, polyquaternium-12, polyquaternium-13, polyquaternium-14, and polyquaternium-15.

Preferred insolubilizing agents include diazonium salts, such as 2-methoxy-4-(phenylamino)-benzenediazonium bisulfate and 4-diazo diphenylamine bisulfate. Other useful diazonium salts are those in which the anion is an alkyl or aryl sulfate or alkyl or aryl thiosulfate, such as, 2-methoxy-4-(phenylamino)-benzenediazonium octyl sulfate, 2-methoxy-4-(phenylamino)-benzenediazonium hexadecyl sulfate, 2-methoxy-4-(phenylamino)-benzenediazonium dodecyl sulfate, and 2-methoxy-4-(phenylamino)-benzenediazonium vinyl benzyl thiosulfate. These sulfates and thiosulfates can be prepared by mixing an onium salt, such as an onium chloride, bromide, or bisulfate, containing the desired cation with a sodium or potassium salt containing the desired anion, i.e., the desired alkyl or aryl sulfate or thiosulfate, either in water or in an aqueous solvent including a hydrophilic solvent such as an alcohol, for example methanol, ethanol, or propylene glycol methyl ether, and filtering of the product.

A preferred group of diazonium salts are those in which the cation is a diazonium polycondensation product. These salts are well known to those skilled in the art. They may be prepared, for example, by condensation of a diazo monomer, such as is described in Toyama, U.S. Pat. No. 4,687,727, with a condensation agent, such as formaldehyde, acetaldehyde, propionaldehyde, butyraldehyde, isobutyraldehyde or benzaldehyde. Mixed condensation products, which comprise units derived from condensable compounds, such as aromatic amines, phenols, phenol ethers, aromatic thioethers, aromatic hydrocarbons, aromatic heterocycles or organic acid amides, may also be used. Especially advantageous diazonium polycondensation products are the reaction products of diphenylamine-4-diazonium salts, optionally having a methoxy group on the phenyl group bearing the diazo group, with formaldehyde or 4,4'-bis-methoxymethyl diphenyl ether. Aromatic sulfonates such as 4-tolylsulfonate or mesitylene sulfonate, or t-butyl naphthalene sulfonate, as well as tetrafluoroborate, hexafluorophosphate, hexafluoroantimonate, and hexafluoroaresenate are particularly suitable as anions of these diazo resins.

The imaging solution typically comprises an aqueous solution of the water-soluble insolubilizing agent. The concentration is typically about 0.2% to 5% by weight, more typically about 0.5% to 3% by weight, even more typically about 1% by weight.

The imaging solution may be applied to the overlayer be any convenient technique. It may, for example, be applied with a cotton swab, such as those available under the name Q-TIP® applicators.

A preferred method of application is with an ink jet printer. Traditionally, digitally controlled inkjet printing uses one of two technologies, drop on demand printing and continuous ink-jet printing. Both technologies feed an imaging liquid, typically an ink, through channels formed in a print head. Each channel includes at least one nozzle from which droplets are selectively extruded and deposited upon a recording surface. Either type of printer may be used in the method of the invention.

In drop-on-demand systems, droplets are only generated and ejected through the print head when they are needed for imaging. Conventional drop-on-demand ink jet printers use a pressurization actuator to produce the droplet at an orifice of the print head. Typically, one of two types of actuators is used. With heat actuators, a heater heats the liquid causing a quantity to change to a gaseous steam bubble that raises the internal pressure sufficiently for a droplet to be expelled. With piezoelectric actuators, an electric field is applied to a piezoelectric material, creating a mechanical stress causing a droplet to be expelled.

Continuous stream or continuous ink jet printing, uses a pressurized source, which produces a continuous stream of droplets. Conventional continuous ink jet printers use electrostatic charging devices that are placed close to the point where a filament of liquid breaks into individual ink droplets. The droplets are electrically charged and then directed to an appropriate location by deflection electrodes having a large potential difference. When no imaging is desired, the droplets are deflected into a capturing mechanism and either recycled or disposed of. When imaging is desired, the droplets are not deflected, but are allowed to strike the recording surface. Alternatively, deflected droplets are be allowed to strike the recording surface, while non-deflected droplets are collected in the capturing mechanism. Continuous ink-jet printers continuously produce smaller droplets for a generally higher resolution, but the imaging liquid must be conductive because the droplets are selectively by deflected electrostatic deflectors.

Suitable ink-jet printers for imagewise application of the imaging liquid may depend on the imaging liquid, and generally include the JetPlate ink-jet printer (Pisces-Print Imaging Sciences, Nashua, N.H., USA), the Xaarjet Evaluation Kit, (Xaarjet, Cambridge, UK), the Hewlett Packard DeskJet 970 CXI and Hewlett Packard 540C ink-jet printers (Hewlett Packard, Palo Alto, Calif., USA), the Epson Stylus Color 600, Epson 740, Epson 800, Epson Stylus Color 900, Epson Stylus PRO9600, Epson Stylus Color 3000 ink-jet printers (Epson, Long Beach, Calif., USA).

The overlayer is preferably not photosensitive. However, when the imaging solution comprises a thermally liable cation and/or a photosensitive compound, the imaged precursor may be heated and/or overall exposed with ultraviolet radiation to make the image more durable. The diazonium cation is both thermally labile and sensitive to ultraviolet radiation. Heating and/or ultraviolet exposure may be carried out either before or after development, but is preferably carried out before development. Though not being bound by any theory or explanation, it is thought that when a diazonium salt is present in the imaging solution, an ionic bond is formed during imaging and is converted to a covalent bond during post-imaging heating and/or ultraviolet exposure.

Imaging and optional heating and/or ultraviolet exposure produces an imaged precursor, which comprises a latent image of imaged regions and complementary unimaged regions. The imaged precursor is washed with a aqueous liquid, such as water or fountain solution, either on press or in a conventional rinse/gum apparatus. Surprisingly, the mixture of water-insoluble phenolic resin and surfactant in the overlayer in the unimaged regions, that is, the regions of the overlayer that were not imaged with the imaging solution are removed. This process does not remove the imaged regions, that is, the regions of the overlayer that were imaged with imaging solution.

The imaged imageable element may be developed in water. Although distilled or deionized water may be used, the imaged element typically can be developed in tap water. Although development with tap water will typically be carried out in a separate processor, rather than on press, it is not necessary to prepare and dispose of expensive, high pH developers when water is used. In addition, only a simple processor is necessary so expensive processors are not required to develop the imaged imageable element in water.

Alternatively, the imaged imageable precursor can be directly mounted on press after imaging and developed with fountain solution during the initial prints. No separate development step is needed before mounting on press. This eliminates the separate development step along with both the processor and developer, thus simplifying the printing process and reducing the amount of expensive equipment required. The imaged imageable precursor is mounted on the plate cylinder of a lithographic press and developed with fountain solution by rotating the press cylinders and contacting the precursor with fountain solution.

Numerous aqueous fountain solutions are known to those skilled in the art. Fountain solutions are disclosed, for example, in Matsumoto, U.S. Pat. No. 5,720,800; Archer, U.S. Pat. No. 5,523,194; Chase, U.S. Pat. No. 5,279,648; Bondurant, U.S. Pat. Nos. 5,268,025, 5,336,302, 5,382,298, Egberg, U.S. Pat. No. 4,865,646; and Daugherty, U.S. Pat. No. 4,604,952. Typical ingredients of aqueous fountain solutions, in addition to water, typically deionized water, include pH buffering systems, such as phosphate and citrate buffers; desensitizing agents, such as dextrin, gum arabic, and sodium carboxymethylcellulose; surfactants and wetting agents, such as aryl and alkyl sulfonates, polyethylene oxides, polypropylene oxides, and polyethylene oxide derivatives of alcohols and phenols; humectants, such as glycerin and sorbitol; low boiling solvents such as ethanol and 2-propanol; sequestrants, such as borax, sodium hexametaphosphate, and salts of ethylenediamine tetraacetic acid; biocides, such as isothiazolinone derivatives; and antifoaming agents. Typical pH ranges for fountain solutions are: about 3.7 to about 6.7 for sheet fed presses, and about 7.0 to about 9.6 for web presses.

In conventional wet press lithographic printing, fountain solution and then ink are applied to the printing plate. For presses with integrated inking/dampening system, the ink and fountain solution are emulsified by various press rollers before being transferred to the plate as emulsion of ink and fountain solution. However, in this invention, the ink and fountain solution may be applied in any combination or sequence, as needed for the plate.

For on-press imaging, the imageable precursor is imaged while mounted on a lithographic printing press cylinder, and the imaged imageable precursor is developed on press with fountain solution during the initial press operation. This is especially suitable for computer-to-press application in which the imageable precursor (or precursors, for multiple color presses) is directly imaged on the plate cylinder according to computer generated digital imaging information and, with minimum or no treatment, directly prints out regular printed sheets. On-press imaging may be carried out on, for example, a Quickmaster DI 46-4 press (Heidelberger Druckmaschinen, Heidelberg, Germany).

INDUSTRIAL APPLICABILITY

Once a lithographic printing plate precursor has been imaged and developed to form a lithographic printing plate, either off press or on press, printing can then be carried out. If imaging is carried off press, the imaged precursor is either developed off press and the resulting lithographic printing plate mounted on a press, or the imaged precursor is mounted on the press and developed with fountain solution. If imaging is carried out on press, the imaged precursor is developed on press with fountain solution.

Printing is carried out by applying fountain solution and then lithographic ink to the resulting image. Fountain solution is taken up by the surface of the hydrophilic substrate revealed by the imaging and development process, and the ink is taken up by the regions not removed by the development process. The ink is then transferred to a suitable receiving material (such as cloth, paper, metal, glass or plastic) either directly or indirectly using an offset printing blanket to provide a desired impression of the image thereon.

EXAMPLES

| Glossary | |
|---|---|
| Combifix | Etch (Horstmann-Steinberg, Germany) |
| DR93 | Diazonium salt, condensation product of 3-methoxy-4-diazodiphenylamine and 4,4'bismethoxymethyldiphenyl ether, with a mesitylene sulfonate counter ion |
| DR83 | Diazonium salt, condensation product of 4-diazodiphenylamine and 4,4'-bismethoxymethyl diphenyl ether, with a phosphate counter ion |
| LB6564 | Cresol/phenol novolac resin (Bakelite, Southampton, UK) |
| LB744 | Cresol novolac resin (Bakelite, Southampton, UK) |
| LODYNE ® S-228M | Anionic surfactant, blend of fluoro and silicone surfactants (Ciba Specialty Chemicals, Tarrytown, NY, USA) |
| N-13 | Novolac resin; 100% m-cresol; MW 13,000 (Eastman Kodak Rochester, NY, USA) |
| SDS | Sodium dodecyl sulfate (sodium lauryl sulfate) (Aldrich, Milwaukee, WI, USA) |
| Substrate A | 0.3 mm thick aluminum sheet which had been electrograined, anodized and treated with a solution of polyvinylphosphonic acid |
| Varn Litho Etch142W | Etch (Varn International, Addison, IL, USA) |
| Varn Neutraweb | Etch (Varn International, Addison, IL, USA) |
| Varn PAR (alcohol sub) | Etch (Varn International, Addison, IL, USA) |
| Varn Premier Edition | Etch (Varn International, Addison, IL, USA) |
| Varn SP444 | Etch (Varn International, Addison, IL, USA) |
| ZONYL ® FSN | Fluorosurfactant (DuPont, Wilmington, Delaware, USA) |

Fountain Solution A is about 23.5 ml/L (3 oz per gallon) Varn Litho Etch142W, and about 23.5 ml/L (3 oz per gallon) Varn PAR (alcohol sub) in water. This fountain solution had a pH of 4.

Fountain Solution B is about 23.5 ml/L (3 oz per gallon) Varn Neutraweb (3 oz), and about 23.5 ml/L (3 oz per gallon) Varn PAR (alcohol sub) in water. This fountain solution had a pH of 6.

Fountain Solution C is about 23.5 ml/L (3 oz per gallon) of Varn SP444 and about 23.5 ml/L (3 oz per gallon) of Varn PAR (alcohol sub) in water. This fountain solution had a pH of 3.8.

Fountain Solution D is about 23.5 ml/L (3 oz per gallon) of Varn Premier Edition and about 23.5 ml/L (3 oz per gallon) Varn PAR (alcohol sub) in water. This fountain solution had a pH of 9.6.

Fountain Solution E is 90% about 31.3 ml/l (4 oz per gallon) of Combifix in water and 10% iso-propyl alcohol. This fountain solution had a pH of 4.5.

Example 1

This example illustrates preparation and imaging of an imageable precursor in which the imaging solution comprises a diazonium salt.

LB6564 (4.05 g) and NaOH (1.0 g) were dissolved in water (100 ml). The resulting mixture was diluted to 500 ml with water, and SDS (2.16 g) was added. The resulting deep red solution was neutralized with 1 M sulfuric acid. At the equivalence point the solution color changed from deep red to orange/red. SDS does not cause the phenolic resin to precipitate out of solution.

LODYNE® S-228M (1.86 g of a 27% solution in water) was added to an aliquot (49.5 g) of this solution. To form the overlayer, the resulting solution was applied to Substrate A using a wire wound bar (green bar, RK bar number 3, 0.0075 mm (0.003 inch) wire diameter). The resulting imageable precursor was dried at 65° C. for 20 seconds in a Mathis labdryer oven (Werner Mathis, Switzerland). Calculated dry coating weight of the overlayer: 0.5 g/m$^2$.

An imaging solution, DR83 (0.56 g) dissolved in water (50 ml), was applied to the overlayer using a cotton-tipped applicator swab. The imaged overlayer was allowed to air-dry. It was developed by drenching in tap water for 20 seconds and rubbing with a wet cotton pad for a further 10 seconds. The areas of the overlayer without applied imaging solution washed away. The resulting image was hand-inked with printing ink using the same wet pad. The ink stuck preferentially to the image. The revealed aluminum substrate rejected the applied ink and remained clean.

Example 2

Example 1 was repeated except that DR93 was used in place of DR83. The ink stuck preferentially to the image. The revealed aluminum substrate rejected the applied ink and remained clean.

Example 3

Example 1 was repeated, except that ZONYL® FSN (1.86 g of a 1% solution in water) was used in place of LODYNE® S-228M. The ink stuck preferentially to the image. The revealed aluminum substrate rejected the applied ink and remained clean.

Example 4

Example 2 was repeated, except that ZONYL® FSN (1.86 g of a 1% solution in water) was used in place of LODYNE® S-228M. The ink stuck preferentially to the image. The revealed aluminum substrate rejected the applied ink and remained clean.

Example 5

Example 2 was repeated, except the LB6564 and NaOH were dissolved in 100 ml of water and the resulting mixture was diluted to 250 ml with water so that a thicker overlayer could applied to the substrate. Calculated dry coating weight of the overlayer: 0.75 g/m$^2$. When developed, the areas of the overlayer without applied imaging solution washed away. When printing ink was applied, the ink stuck preferentially to the image. The revealed aluminum substrate rejected the applied ink and remained clean.

Example 6

Example 5 was repeated, except that Fountain Solution A was used instead of tap water in the 20 second drenching step. The areas of the overlayer without applied imaging solution washed away. When printing ink was applied, the ink stuck preferentially to the image. The revealed aluminum substrate rejected the applied ink and remained clean.

Example 7

Example 5 was repeated, except that Fountain Solution B was used instead of tap water in the 20 second drenching step. The areas of the overlayer without applied imaging solution washed away. When printing ink was applied, the ink stuck preferentially to the image. The revealed aluminum substrate rejected the applied ink and remained clean.

Example 8

Example 5 was repeated, except that Fountain Solution C was used instead of tap water in the 20 second drenching step. The areas of the overlayer without applied imaging solution washed away. When printing ink was applied, the ink stuck preferentially to the image. The revealed aluminum substrate rejected the applied ink and remained clean.

Example 9

Example 5 was repeated, except that Fountain Solution D was used instead of tap water in the 20 second drenching step. When printing ink was applied, the ink stuck preferentially to the image. The revealed aluminum substrate rejected the applied ink and remained clean.

Example 10

Example 5 was repeated, except that Fountain Solution F was used instead of tap water in the 20 second drenching step. When printing ink was applied, the ink stuck preferentially to the image. The revealed aluminum substrate rejected the applied ink and remained clean.

Example 11

Example 5 was repeated, except that after the application of the imaging solution, the imaged imageable precursor was heated at 65° C. for 60 seconds, without allowing the image to air dry. The resulting imaged and dried imageable precursor was mounted on an AB Dick Duplicator press (AB Dick, Niles, Ill., USA). The press was set up with Van Son Rubberbase ink. The fountain solution was Varn 142W fountain at a concentration of 23.5 ml/L per gallon (3 oz per gallon) of water and Varn PAR alcohol replacement at a concentration of 23.5 ml/L (3 oz per gallon) of water.

After 25 impressions the unimaged regions were satisfactorily clean of ink. The image area accepted ink from the 10th impression on. Fifty true impressions (i.e., impressions 26 to 75) were completed. Additional impressions could have been made.

Example 12

Example 5 was repeated except that, after the application of the imaging solution, the imaged imageable precursor was irradiated with ultraviolet radiation from a lightframe for 2 minutes. The imaged and irradiated precursor was mounted on an AB Dick Duplicator press. After 25 impressions the unimaged regions were satisfactorily clean of ink. The image area accepted ink from the 10th impression on. Fifty true impressions (i.e., impressions 26 to 75) were completed. Additional impressions could have been made.

Example 13

An imageable precursor was prepared as in Example 5. Calculated dry coating weight of the overlayer: 0.75 g/m$^2$. An imaging solution, prepared by dissolving DR93 (0.56 g) in water (50 ml), was decanted into the storage vessel of a JetPlate ink-jet printer (Pisces-Print Imaging Sciences, Nashua, N.H., USA), which had previously been emptied and cleaned.

The JetPlate printer consists of a PC controlled imaging output device, a signal encoder that controls the imaging head and the imaging head. The resolution was set to 710×1440 dpi+EDS screening, without calibration. Media type was set to paper. The imageable precursor was placed on the platten. Where the precursor passed under the imaging head, a clear and accurate copy of the test image was formed. The imaged precursor was dried at 65° C. for 60 seconds. The imaged and dried precursor was drenched in Fountain Solution A for 20 seconds and rubbed with a wet cotton pad for a further 10 seconds. The unimaged regions of the overlayer washed away. The sample was then hand-inked with printing ink using the same wet pad. The ink stuck preferentially to the image. The revealed aluminum substrate rejected the applied ink and remained clean.

Example 14

An imageable precursor was prepared by the procedure of Example 1, except that LB744 (4.05 g) was used in place of LB6564. Calculated dry coating weight of the overlayer: 0.5 g/m$^2$.

The precursor was imaged as in Example 1. The imaged and dried imageable precursor was drenched in Fountain Solution A for 20 seconds and rubbed with a wet cotton pad for a further 10 seconds. The unimaged regions of the overlayer washed away. The resulting printing plate was hand-inked with printing ink using the same wet pad. The ink stuck preferentially to the image. The revealed aluminum substrate rejected the applied ink and remained clean.

Example 15

Example 13 was repeated, except that after imaging and drying, the imaged and dried precursor was mounted on an AB Dick duplicator press. After 25 impressions the unimaged regions were satisfactorily clean of ink. The image area accepted ink from the 10th impression on. Fifty true impressions (i.e., impressions 26 to 75) were completed. Additional impressions could have been made.

Example 16

N13 (4.05 g) and NaOH (1.0 g) were dissolved in water (100 ml). The resulting mixture was diluted to 750 ml with water and SDS (2.16 g) was added. The resulting deep red solution was neutralized with 1 M sulfuric acid. At the equivalence point the solution color changed from deep red to orange/red. SDS does not cause the phenolic resin to precipitate out of solution.

LODYNE® S-228M (1.86 g of a 27% solution in water) was added to an aliquot (49.5 g) of this solution. The resulting coating solution was applied to the aluminum substrate using a wire wound bar (green bar, RK bar number 3, 0.003 inch wire diameter). The resulting imageable precursor was dried at 65° C. for 20 seconds in the Mathis labdryer oven. Calculated dry coating weight of the overlayer: 0.25 g/m$^2$.

An imaging solution, DR93 (0.56 g) dissolved in water (50 ml), was applied to the overlayer with a cotton-tipped applicator swab. The imaged imageable precursor was dried at 65° C. for 60 seconds. The overlayer was drenched in Fountain Solution A for 20 seconds and rubbed with a wet cotton pad for a further 10 seconds. The unimaged regions of the overlayer washed away. The resulting image was hand-inked using the same wet pad with printing ink applied. The ink stuck preferentially to the image. The revealed aluminum substrate rejected the ink and remained clean.

Example 17

The procedure of Example 16 was repeated except that ZONYL® FSN (1.86 g of a 1% solution in water) was used instead of SDS. The unimaged regions of the overlayer washed away. When the image was hand-inked, the ink stuck preferentially to the image. The revealed aluminum substrate rejected the ink and remained clean.

Having described the invention, we now claim the following and their equivalents.

What is claimed is:

1. A method for forming an image, the method comprising the steps of:

a) imaging an imageable precursor that comprises an overlayer over a substrate by imagewise applying an imaging solution to the overlayer and forming an imaged precursor comprising imaged and complementary unimaged regions in the overlayer;

in which:

the substrate has a hydrophilic surface;

the overlayer is over the hydrophilic surface of the substrate;

the overlayer comprises a water-solubilized phenolic resin;

the water-solubilized phenolic resin comprises a water-insoluble novolac resin and a surfactant selected from the group consisting of anionic surfactants, nonionic surfactants, and mixtures thereof; and the imaging solution comprises a water soluble insolubilizing agent; and b) developing the imaged precursor with an aqueous liquid and removing the unimaged regions, thus revealing the underlying hydrophilic surface of the substrate, without removing the imaged regions.

2. The method of claim 1 in which the insolubilizing agent contains a cationic group.

3. The method of claim 2 in which the surfactant is an anionic surfactant.

4. The method of claim 3 in which the insolubilizing agent is selected from the group consisting of cationic dispersing agents, cationic polymers, and diazonium salts.

5. The method of claim 1 in which the aqueous liquid is either water or a fountain solution.

6. The method of claim 5 in which the insolubilizing agent comprises a diazonium salt.

7. The method of claim 6 additionally comprising, after step a), an additional step of either heating the imaged imageable precursor, irradiating the imaged imageable precursor with ultraviolet radiation, or heating the imaged imageable precursor and irradiating the imaged imageable precursor with ultraviolet radiation.

8. The method of claim 7 in which the additional step is carried out after step a) and before step b).

9. The method of claim 6 in which the diazonium salt is an alkyl or aryl sulfate or an alkyl or aryl thiosulfate.

10. The method of claim 1 in which the insolubilizing agent comprises a diazonium salt and the method additionally comprises an additional step of, after step a), of either heating the imaged imageable precursor, irradiating the imaged imageable precursor with ultraviolet radiation, or heating the imaged imageable precursor and irradiating the imaged imageable precursor with ultraviolet radiation.

11. The method of claim 10 in which the additional step is carried out after step a) and before step b).

12. The method of claim 11 in which the surfactant is an anionic surfactant.

13. The method of claim 1 in which the aqueous liquid is a fountain solution.

14. The method of claim 13 in which step b) is carried out on press.

15. The method of claim 13 in which the insolubilizing agent comprises a diazonium salt and the surfactant is an anionic surfactant.

16. The method of claim 15 additionally comprising, after step a), an additional step of either heating the imaged imageable precursor, irradiating the imaged imageable precursor with ultraviolet radiation, or heating the imaged imageable precursor and irradiating the imaged imageable precursor with ultraviolet radiation.

17. The method of claim 1 in which the water-insoluble novolac resin is water solubilized by the formation of micelles.

18. The method of claim 17 in which the insolubilizing agent comprises a diazonium salt and the surfactant is an anionic surfactant.

19. The method of claim 18 additionally comprising, after step a), an additional step of either heating the imaged imageable precursor, irradiating the imaged imageable precursor with ultraviolet radiation, or heating the imaged imageable precursor and irradiating the imaged imageable precursor with ultraviolet radiation.

20. The method of claim 1 in which the insolubilizing agent comprises a diazonium salt, the surfactant is an anionic surfactant, the aqueous liquid is a fountain solution, and step b) is carried out on press.

21. The method of claim 20 in which step a) is carried out on press.

22. The method of claim 6 in which the diazonium salt is an aromatic sulfonate.

23. The method of claim 22 in which the diazonium salt is the condensation product of 3-methoxy-4-diazodiphenylamine and 4 4'-bismethoxymethyldiphenyl ether with a mesitylene sulfonate counter ion.

24. The method of claim 23 in which step a) is carried out off press and step b) is carried out on press.

25. The method of claim 1 in which step a) is carried out off press and step b) is carried out on press.

26. The method of claim 7 in which the additional step is the step of either irradiating the imaged imageable precursor with ultraviolet radiation, or the step of heating the imaged imageable precursor and irradiating the imaged imageable precursor with ultraviolet radiation.

27. The method of claim 19 in which the additional step is the step of either irradiating the imaged imageable precursor with ultraviolet radiation, or the step of heating the imaged imageable precursor and irradiating the imaged imageable precursor with ultraviolet radiation.

28. The method of claim 5 in which the aqueous liquid is water.

29. The method of claim 28 in which the insolubilizing agent comprises a diazonium salt and the surfactant is an anionic surfactant.

* * * * *